(12) United States Patent
Sawada et al.

(10) Patent No.: US 9,839,119 B2
(45) Date of Patent: *Dec. 5, 2017

(54) ELECTRICALLY CONDUCTIVE FILM

(71) Applicant: PANASONIC INTELLECTUAL PROPERTY MANAGEMENT CO., LTD., Osaka (JP)

(72) Inventors: Tomoaki Sawada, Osaka (JP); Shingo Yoshioka, Osaka (JP); Takatoshi Abe, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 85 days.

This patent is subject to a terminal disclaimer.

(21) Appl. No.: 14/405,533

(22) PCT Filed: Oct. 8, 2014

(86) PCT No.: PCT/JP2014/005131
§ 371 (c)(1),
(2) Date: Dec. 4, 2014

(87) PCT Pub. No.: WO2015/052931
PCT Pub. Date: Apr. 16, 2015

(65) Prior Publication Data
US 2016/0266668 A1 Sep. 15, 2016

(30) Foreign Application Priority Data

Oct. 10, 2013 (JP) .................................. 2013-212790
Mar. 7, 2014 (WO) .................. PCT/JP2014/001304

(51) Int. Cl.
| | | |
|---|---|---|
| G06F 3/041 | (2006.01) | |
| H01B 1/24 | (2006.01) | |
| H01L 31/0224 | (2006.01) | |
| H05K 1/02 | (2006.01) | |
| H05K 1/03 | (2006.01) | |
| C08J 5/18 | (2006.01) | |
| C08K 7/02 | (2006.01) | |
| C08L 101/00 | (2006.01) | |
| H01B 1/02 | (2006.01) | |
| C08J 7/04 | (2006.01) | |
| C09D 105/16 | (2006.01) | |
| B32B 5/02 | (2006.01) | |

(Continued)

(52) U.S. Cl.
CPC ............. *H05K 1/0271* (2013.01); *B32B 5/02* (2013.01); *C08J 5/18* (2013.01); *C08J 7/047* (2013.01); *C08K 7/02* (2013.01); *C08L 101/00* (2013.01); *C09D 105/16* (2013.01); *C09D 163/00* (2013.01); *G06F 3/041* (2013.01); *H01B 1/02* (2013.01); *H01B 1/24* (2013.01); *H01L 31/022466* (2013.01); *H01L 31/022491* (2013.01); *H05K 1/028* (2013.01); *H05K 1/0213* (2013.01); *H05K 1/0274* (2013.01); *H05K 1/0296* (2013.01); *H05K 1/0326* (2013.01); *H05K 1/0333* (2013.01); *H05K 1/0366* (2013.01); *B32B 3/12* (2013.01); *B32B 3/266* (2013.01); *B32B 15/08* (2013.01); *B32B 15/092* (2013.01); *B32B 2260/021* (2013.01); *B32B 2260/046* (2013.01); *B32B 2262/103* (2013.01); *B32B 2262/106* (2013.01); *B32B 2262/14* (2013.01); *B32B 2307/202* (2013.01); *B32B 2307/412* (2013.01); *B32B 2307/50* (2013.01); *B32B 2363/00* (2013.01); *C08J 2300/21* (2013.01); *C08J 2367/02* (2013.01); *C08J 2400/21* (2013.01); *C08J 2463/00* (2013.01); *H05K 2201/012* (2013.01); *H05K 2201/0108* (2013.01); *H05K 2201/0323* (2013.01); *H05K 2201/0326* (2013.01); *Y10T 428/24331* (2015.01); *Y10T 428/24917* (2015.01)

(58) Field of Classification Search
CPC ..... G06F 3/041; B32B 5/02; B32B 2260/021; B32B 2260/046; B32B 2262/106; B32B 2262/103; B32B 2262/14
See application file for complete search history.

(56) References Cited

U.S. PATENT DOCUMENTS

| | | |
|---|---|---|
| 7,626,128 B2 | 12/2009 | Yasushi et al. |
| 2003/0138398 A1 | 7/2003 | Okumura et al. |

(Continued)

FOREIGN PATENT DOCUMENTS

| | | |
|---|---|---|
| CN | 103224711 A | 7/2013 |
| EP | 0560380 A1 | 9/1993 |

(Continued)

OTHER PUBLICATIONS

U.S. Office Action issued with respect to U.S. Appl. No. 14/405,572, dated Feb. 1, 2016.

(Continued)

*Primary Examiner* — Hai Vo
(74) *Attorney, Agent, or Firm* — Greenblum & Bernstein, P.L.C.

(57) ABSTRACT

The present invention relates to an electrically conductive film characterized by being able to undergo elastic deformation, having little residual strain rate and exhibiting stress relaxation properties. More specifically, the present invention relates to an electrically conductive film wherein the stress relaxation rate (R) and the residual strain rate (alpha), as measured in a prescribed extension-restoration test, are as follows: $20\% \leq R \leq 95\%$ and $0\% \leq \alpha \leq 3\%$.

11 Claims, No Drawings

(51) Int. Cl.
*C09D 163/00* (2006.01)
*B32B 15/092* (2006.01)
*B32B 15/08* (2006.01)
*B32B 3/12* (2006.01)
*B32B 3/26* (2006.01)

(56) References Cited

U.S. PATENT DOCUMENTS

| | | |
|---|---|---|
| 2008/0097039 A1 | 4/2008 | Ito et al. |
| 2008/0143906 A1 | 6/2008 | Allemand et al. |
| 2009/0079322 A1 | 3/2009 | Tsutsumi et al. |
| 2009/0088546 A1 | 4/2009 | Ito et al. |
| 2010/0129677 A1 | 5/2010 | Ito et al. |
| 2010/0247810 A1 | 9/2010 | Yukinobu et al. |
| 2010/0252184 A1* | 10/2010 | Morimoto ............... B82Y 30/00 156/241 |
| 2011/0088770 A1 | 4/2011 | Allemand et al. |
| 2011/0281070 A1* | 11/2011 | Mittal ............ H01L 31/022466 428/142 |
| 2011/0291058 A1 | 12/2011 | Yousuke et al. |
| 2012/0220728 A1 | 8/2012 | Uekusa et al. |
| 2013/0057138 A1 | 3/2013 | Tsutsumi et al. |
| 2014/0377579 A1 | 12/2014 | Zhifeng et al. |
| 2015/0373838 A1* | 12/2015 | Sawada ................ C09D 105/16 136/256 |

FOREIGN PATENT DOCUMENTS

| | | |
|---|---|---|
| EP | 2 497 789 A1 | 9/2012 |
| JP | 2002-339205 A | 11/2002 |
| JP | 2003-113561 A | 4/2003 |
| JP | 2005-154675 A | 6/2005 |
| JP | 2009-76361 A | 4/2009 |
| JP | 2009-163959 | 7/2009 |
| JP | 2009-163959 A | 7/2009 |
| JP | 2010-507199 A | 3/2010 |
| JP | 4482633 B2 | 6/2010 |
| JP | 2012-27488 A | 2/2012 |
| JP | 2012-63437 A | 3/2012 |
| WO | 2001/83566 A1 | 11/2001 |
| WO | 2009/057637 A1 | 5/2009 |

OTHER PUBLICATIONS

Written Opinion of the International Searching Authority and International Search Report for PCT application No. PCT/JP2014/005131, dated Jan. 23, 2015.

Database WPI, Week 200952, Thomson Scientific, London, GB; AN 2009-L75862 XP002734421, & JP2009-163959 A (Toray Ind Inc), Jul. 23, 2009.

International Search Report issued with respect to application No. PCT/JP2014/001304, dated Jul. 8, 2014.

* cited by examiner ically conductive film characterized by being able to undergo elastic deformation, having little residual strain and exhibiting stress relaxation properties.

ELECTRICALLY CONDUCTIVE FILM

TECHNICAL FIELD

The present invention relates to an electrically conductive film having high tensile stress relaxation properties and excellent recoverability following extension.

BACKGROUND ART

Demands are increasing in terms of attachability and shape following properties for devices and electrically conductive materials used in a variety of interfaces in the field of electronics, and especially sensors, displays and artificial skin for robots. Depending on the intended use, flexible devices require the ability to be disposed on curved surfaces or concavoconvex surfaces and to be freely deformed.

As an example of this type of electrically conductive material, films and glasses that use ITO have been widely used in the past as transparent electrically conductive materials for displays. However, such ITO films exhibit poor flexibility, undergo large changes in resistance as a result of deformations such as bending or stretching, and show a tendency to break. As a result, transparent electrically conductive films formed in a state whereby carbon nanotubes are highly dispersed in the film have been developed as flexible electrically conductive films (see Patent Documents 1 and 2).

Such electrically conductive films that use carbon nanotubes use plastic substrates such as PET films, and therefore exhibit excellent flexibility and can be molded to concavoconvex surfaces. However, substrates used in such electrically conductive films are not stretchable and cannot be said to be satisfactory in terms of attachability and ability to follow a variety of shapes.

In addition, electrically conductive films that use silver nanowires in the same way have been developed (see Patent Document 3), but there is no prior art that mentions the attachability and shape following properties of electrically conductive films that use silver nanowires, and for the same reasons as those given above, it is still the case that requirements relating to stretchability and shape following properties cannot be satisfied.

CITATION LIST

Patent Literature

[Patent Document 1] WO 2009/057637
[Patent Document 2] Japanese Patent Application Publication No. 2009-163959
[Patent Document 3] Japanese Translation of PCT Application No. 2010-507199

SUMMARY OF INVENTION

In view of circumstances such as those mentioned above, an object of the present invention is to provide an electrically conductive film which exhibits recoverability following extension and stress relaxation properties, thereby addressing the requirements of attachability and shape following properties.

That is, one aspect of the present invention is an electrically conductive film characterized by being able to undergo elastic deformation, having little residual strain and exhibiting stress relaxation properties.

In addition, another aspect of the present invention is a variety of devices that use this electrically conductive film (displays, touch sensors, solar cells, and the like).

DESCRIPTION OF EMBODIMENTS

As a result of diligent research, the inventors of the present invention managed to provide an electrically conductive film which exhibits both stretchability and stress relaxation properties, which has little residual strain upon recovery after extension and which can relax residual stress upon deformation by forming an electrically conductive layer having a mesh-like structure formed from a fibrous electrically conductive filler on a substrate that is able to undergo elastic deformation.

According to the present invention, it is thought that it is possible to provide an electrically conductive film which exhibits excellent recoverability following extension and stress relaxation properties and which does not lose electrical conductivity even when subjected to deformations such as extension or recovery. In addition, this electrically conductive film can be used in a variety of interfaces, such as sensors or displays, which require attachability and shape following properties.

In addition to interfaces, this electrically conductive film can also be used in a variety of applications that require attachability and shape following properties, such as flexible batteries, including solar cells, medical applications and automotive applications, and is therefore industrially applicable and extremely useful.

Embodiments of the present invention will now be explained in greater detail, but the present invention is not limited to these embodiments.

The electrically conductive film of the present embodiment has a structure whereby an electrically conductive layer having a mesh-like structure formed from a fibrous electrically conductive filler is formed on one surface of a resin substrate able to undergo elastic deformation. Here, able to undergo elastic deformation means that a deformation occurring as a result of being subjected to a force returns to its initial state once the force is removed, and more specifically means that even if the film is subjected to a stretching deformation of at least 25%, the film returns to its original state once the force is removed.

In the present embodiment, ability to undergo elastic deformation and having little residual strain rate more specifically means that plastic deformation does not occur and residual strain rate is preferably 3% or lower. In addition, exhibiting stress relaxation properties means that when a force (for example, a tensile force) is applied, the applied stress is reduced, thereby reducing residual stress.

For the sake of convenience, the residual strain rate and stress relaxation properties of the resin composition are defined in the present embodiment by the stress relaxation rate (R) and the residual strain rate α(alpha), as measured in the extension-restoration test described below.

It is preferable for the resin composition of the present embodiment to be a resin composition in which the stress relaxation rate (R) is 20 to 95% and the residual strain rate α is 0 to 3%.

In the present embodiment, the electrically conductive film having a structure whereby an electrically conductive layer having a mesh-like structure formed from a fibrous electrically conductive filler is formed on one surface of a resin substrate able to undergo elastic deformation has a residual strain rate of 0 to 3% and a stress relaxation rate of 20 to 95%.

It is thought that an electrically conductive film having a residual strain rate and stress relaxation rate that fall within ranges such as these will exhibit excellent recoverability following extension, high stress relaxation properties during tension, and excellent attachability and shape following properties.

In addition, it is preferable for the electrically conductive film of the present embodiment to exhibit high electrical conductivity, and if transparency is also high, the electrically conductive film can be used as a transparent electrically conductive film. Electrically conductive films are used in a variety of applications, but electrically conductive films having a surface resistance of 1000 W/or lower can be advantageously used as electrodes for touch sensors, and highly transparent electrically conductive films (having a total light transmittance of 70% or higher) can be advantageously used as transparent electrodes for displays and the like.

<Extension-Restoration Test>

In the extension-restoration test used in the present embodiment, a piece of film (thickness: 50 micrometer, sample shape: No. 6 type dumbbell (width of measured portion: 4 mm, length of linear portion: 25 mm)) is subjected to an extension process and then a restoration process under the conditions described below using a tensile-compression tester (for example, an Autograph (model AGS-X) manufactured by Shimadzu Corporation) in accordance with ISO 3384, and the stress relaxation rate (R) and the residual strain rate α are calculated using the calculation methods described below.

(Extension Process Conditions)

In order to eliminate deflection generated when the test piece is attached to the clamp, deflection correction is carried out at a force of 0.05 N or lower.

Speed of testing: 25 mm/min (0 to 25% extension)
Temperature conditions: 23 degrees Celsius
(Restoration Process Conditions)
Speed of testing: 0.1 mm/min (until the tensile force reaches $0 \pm 0.05$ N )
Temperature conditions: 23 degrees Celsius Stress relaxation rate calculation method: The tensile force is measured at the point when the extension process is complete, and this is defined as the initial tensile force ($F_{A0}$). The amount of strain is then maintained for 5 minutes under the extension/holding conditions, after which the tensile force is measured. This is defined as $F_A(t_5)$. The stress relaxation rate (R) is calculated using the following formula.

$$R = \frac{F_{AO} - F_A(t5)}{F_{AO}} \times 100$$

Residual strain rate calculation method: The amount of strain is measured at the point where the tensile force in the restoration process reaches $0 \pm 0.05$ N, and this is defined as the residual strain rate α.

The resin composition used in the resin substrate in the present embodiment is not particularly limited in terms of composition as long as it is possible to form a resin substrate of an electrically conductive film which satisfies the characteristics mentioned above and which is able to undergo elastic deformation.

It is preferable for the resin composition of the present embodiment to contain at least a thermosetting resin and a curing agent for this resin. Furthermore, an epoxy resin is a preferred example of the thermosetting resin.

A more specific embodiment thereof is, for example, a resin composition that contains (A) a polyrotaxane, (B) a thermosetting resin and (C) a curing agent. These components will now be explained in greater detail.

The polyrotaxane of the component (A) is a molecule having a structure in which a straight chain axial molecule passes through a cyclic molecule and the axial molecule is blocked at the molecular terminals so that the cyclic molecule cannot become detached. A specific example thereof is the polyrotaxane disclosed in Japanese Patent No. 4482633.

Examples of the polyrotaxane (A) able to be used in the present embodiment include a compound in which a molecule having terminal functional groups, which is an axial molecule, is enclathrated by a cyclic molecule, and these terminal functional groups are chemically modified by blocking groups that are sufficiently bulky for the cyclic molecule not to become detached. A molecule having this type of structure is not limited in terms of the structure and type of the constituent molecules, the enclathration rate of the cyclic molecule, the production method, and so on.

For example, axial molecules able to be contained in the polyrotaxane are not particularly limited as long as the molecule has a molecular weight of 10,000 or higher and can be chemically modified by a blocking group, and examples thereof include poly(vinyl alcohol), polyvinylpyrrolidone, poly(meth)acrylic acid cellulose-based resins, polyacrylamide, poly(ethylene oxide), poly(ethylene glycol), poly(propylene glycol), poly(vinyl acetal)-based resins, poly(vinyl methyl ether), polyamines, polyethyleneimines, casein, gelatin, starch, polyolefins, polyesters, poly(vinyl chloride), polystyrene, copolymers such as acrylonitrile-styrene copolymers, acrylic resins, polycarbonates, polyurethanes, poly(vinyl butyral), polyisobutylene, polytetrahydrofuran, polyamides, polyimides, polydienes, polysiloxanes, polyurea, polysulfides, polyphosphazene, polyketones, polyphenylene, polyhaloolefins, and derivatives thereof. Of these, poly(ethylene glycol) can be advantageously used.

In addition, the cyclic molecule able to be contained in the polyrotaxane is a ringshaped molecule able to be penetrated by a polymer molecule, and is not particularly limited as long as the cyclic molecule has at least one reactive group able to react with a crosslinking agent. Specific examples thereof include cyclodextrin compounds, crown ether compounds, cryptand compounds, macrocyclic amine compounds, calixarene compounds and cyclophane compounds. Of these, cyclodextrin and substituted cyclodextrin compounds are preferred, and substituted cyclodextrin compounds obtained by introducing further reactive groups (functional groups) into the substituted structure are more preferred.

Examples of preferred functional groups introduced into the cyclic molecule of the polyrotaxane include hydroxyl groups, carboxyl groups, acrylic groups, methacrylic groups, epoxy groups, vinyl groups, and the like.

By introducing functional groups into the cyclic molecule in this way, it is possible to crosslink cyclic molecules to each other or crosslink the polyrotaxane and the resin by means of a crosslinking agent. In addition, a resin connected to a polyrotaxane in this way can achieve flexibility.

The structures that block the terminals of the polyrotaxane in the present embodiment (terminal-blocking groups) are not particularly limited as long as these structures are sufficiently bulky for the cyclic molecule not to become detached. Specifically, cyclodextrin groups, adamantane groups, dinitrophenyl groups, trityl groups, and the like can be used, and adamantane groups and the like can be advantageously used.

Molecules able to be used as the cyclic molecule are not particularly limited as long as a liner chain polymer molecule can be enclathrated by the ring of the cyclic molecule. A cyclodextrin is an example of a cyclic molecule able to be advantageously used. In addition, it is preferable for this cyclic molecule to have functional groups. Furthermore, it is preferable for the functional groups to be —OH groups, acrylic groups or methacrylic groups.

The polyrotaxane used in the present embodiment can be synthesized by means of a publicly known method (for example, the methods disclosed in WO 01/83566, Japanese Patent Application Publication No. 2005-154675 or Japanese Patent No. 4482633), but it is also possible to use a commercially available product, specifically SeRM Super Polymer A 1000 manufactured by Advanced Softmaterials, Inc.

Next, the thermosetting resin (B) is not particularly limited, and examples thereof include epoxy resins, phenol resins, polyimide resins, urea-based resins, melamine resins, unsaturated polyesters and urethane-based resins, but of these, epoxy resins are preferred.

Specific examples of the epoxy resin include bisphenol A type epoxy resins, bisphenol F type epoxy resins, bisphenol S type epoxy resins, aralkyl epoxy resins, phenol novolac type epoxy resins, alkylphenol novolac type epoxy resins, biphenol type epoxy resins, naphthalene type epoxy resins, dicyclopentadiene type epoxy resins, epoxidized condensation products of phenol compounds and aromatic aldehydes having phenolic hydroxyl groups, triglycidylisocyanurates and alicyclic epoxy resins. Depending on the circumstances, these epoxy resins can be used singly or as a combination of two or more types thereof.

A more preferred example of the epoxy resin is an epoxy resin which contains 2 or more epoxy groups and 3 methyl groups per molecule and which has a molecular weight of 500 or higher. This type of epoxy resin can be a commercially available one, for example JER1003 (manufactured by Mitsubishi Chemical Corp., 7 to 8 methyl groups, 2 functional groups, molecular weight 1300), EXA-4816 (manufactured by DIC Corporation, molecular weight 824, many methyl groups, 2 functional groups), YP50 (manufactured by Nippon Steel & Sumikin Chemical Co., Ltd., molecular weight 60,000 to 80,000, many methyl groups, 2 functional groups), or the like.

In addition, epoxy resins such as those mentioned above can be used singly or as a combination of two or more types thereof.

The curing agent (C) is not particularly limited as long as the curing agent can act as a curing agent for the thermosetting resin of component (B). In particular, examples of preferred curing agents able to be used as curing agents for epoxy resins include phenol resins, amine-based compounds, acid anhydrides, imidazole-based compounds, sulfide compounds and dicyandiamide. In addition, it is possible to use a photoinitiator, a UV initiator or a thermal cationic initiator. Depending on the circumstances, these curing agents can be used singly or as a combination of two or more types thereof.

In addition, the polyrotaxane-containing resin composition of the present embodiment may further contain a crosslinking agent, and this crosslinking agent is not particularly limited as long as it is possible to create a structure in which at least a part of the cyclic molecule in the polyrotaxane (at least 1 reactive group in the cyclic molecule of the polyrotaxane) is crosslinked.

More specifically, it is possible to use an isocyanate, cyanuric chloride, trimesoyl chloride, terephthaloyl chloride, epichlorohydrin, dibromobenzene, glutaraldehyde, phenylene diisocyanate, tolylene diisocyanate, divinylsulfone, 1,1-carbonyldiimidazole, an alkoxysliane, and the like.

In the present embodiment, the number of functional groups in the crosslinking agent is not limited, but it is preferable for a molecule of the crosslinking agent to have 2 or more functional groups in order to crosslink cyclic molecules of the polyrotaxane to each other or crosslink the cyclic molecule and a resin such as that described below. In addition, in cases where the crosslinking agent contains a plurality of functional groups, these functional groups may be the same or different.

Furthermore, crosslinking agents that are compatible with polyrotaxanes are more preferred, and in cases where a polyrotaxane containing a cyclic molecule having a hydroxyl group is used as the polyrotaxane of component (A), an isocyanate compound, a derivative thereof, or the like can be advantageously used as the crosslinking agent. This isocyanate resin is not particularly limited. In addition, it is also possible to use a blocked isocyanate resin having a blocked isocyanate group.

Meanwhile, in cases where a polyrotaxane containing a cyclic molecule having an acrylic group or a methacrylic group is used as the polyrotaxane of component (A), it is possible to add an acrylic resin as a reactive resin. This acrylic resin is not particularly limited.

The proportions of the components in the resin composition are not particularly limited as long as the effect of the present invention can be achieved, but are 10 to 80 parts by mass, and preferably approximately 30 to 50 parts by mass, of the polyrotaxane (A), 10 to 89.9 parts by mass, and preferably 30 to 50 parts by mass, of the thermosetting resin (B), and 0.1 to 30 parts by mass, and preferably approximately 0.1 to 20 parts by mass, of the curing agent (C), relative to a total of 100 parts by mass of the components (A) to (C). Moreover, in cases where the resin composition of the present embodiment contains an isocyanate resin as a crosslinking agent, it is possible to add 0 to 50 parts by mass, and preferably 10 to 40 parts by mass, of the isocyanate resin to the polyrotaxane component (A).

Furthermore, the resin composition according to the present embodiment may, if necessary, contain other additives, such as a curing catalyst (a curing accelerator), a flame retardant, an auxiliary flame retardant, a leveling agent or a coloring agent, at quantities whereby the effect of the present invention is not impaired.

The method for producing the polyrotaxane-containing resin composition of the present embodiment is not particularly limited, and it is possible to obtain the resin composition of the present embodiment by, for example, homogeneously mixing a polyrotaxane, a curing agent, a crosslinking agent, a thermosetting resin and a solvent. The solvent used is not particularly limited, and can be toluene, xylene, methyl ethyl ketone, acetone, or the like. These solvents can be used singly or as a combination of two or more types thereof. In addition, if necessary, it is possible to blend an organic solvent or a variety of additives in the resin composition in order to adjust the viscosity of the composition.

By heating and drying the resin composition obtained in the manner described above, it is possible to cure the composition while evaporating off the solvent, thereby obtaining a resin substrate of film.

The method and apparatus used to heat and dry the resin composition, and the conditions used therefor, may be similar means to those used in the past or means obtained by improving those used in the past. The specific heating temperature and period can be set as appropriate according to the crosslinking agent and solvent used, and the like, but by heating and drying for a period of 60 to 120 minutes at a temperature of 50 to 200 degrees Celsius, for example, it is possible to cure the resin composition.

Next, another example of a specific embodiment of the resin composition used for the resin substrate of the present embodiment is, for example, a resin composition which contains (D) an epoxy resin, which is characterized by having a modified group that is modified by an alkylene oxide having 2 to 3 carbon atoms, containing this modified group at a quantity of 4 moles or more relative to 1 mole of epoxy groups in the molecule, having 2 moles or more of epoxy groups and having an epoxy equivalent quantity of 450 eq/mol or higher, and (E) a curing agent.

Specific examples of the epoxy resin (D) include a propylene oxide adduct type bisphenol A type epoxy resin (EP4003S manufactured by Adeka Corporation) and an ethylene oxide adduct type hydroxyphenylfluorene type epoxy resin (EG-280 manufactured by Osaka Gas Chemicals Co., Ltd.).

In addition, the epoxy resin-containing resin composition of the present embodiment may further contain an epoxy resin other than the epoxy resin (D) described above, such as a bisphenol A type epoxy resin, a bisphenol F type epoxy resin, a bisphenol S type epoxy resin, an aralkyl epoxy resin, an aliphatic epoxy resin or an alicyclic epoxy resin, at a quantity whereby the effect of the present invention is not impaired.

In such cases, the blending proportion of the epoxy resin (D) in the overall epoxy resin component is approximately 60 to 99 mass %, and preferably approximately 80 to 95 mass %.

The curing agent (E) can be one that is publicly known as a curing accelerator for epoxy resins. Specifically, a curing agent selected from among phenolic resins, acid anhydrides and sulfonium salts is preferred from the perspective of curing properties and, if necessary, it is possible to use a combination of this type of curing agent and a curing accelerator such as an imidazole-based compound or a combination of two or more of these curing agents.

The phenol curing agent can be a monomer, oligomer or polymer having 2 or more phenolic hydroxyl groups in the molecule and is not particularly limited in terms of molecular weight or molecular structure, but it is possible to use, for example, are resin obtained by subjecting a phenol compound, such as phenol, cresol, resorcin, catechol, bisphenol A, bisphenol F, phenylphenol or aminophenol, and/or a naphthol compound, such as α-naphthol, β-naphthol or dihydroxynaphthalene, and a compound having an aldehyde group, such as formaldehyde, to condensation or co-condensation in the presence of an acidic catalyst, examples of such resins being phenol novolac resins and cresol novolac resins, or a phenol aralkyl resin synthesized from a phenol compound and/or a naphthol compound and dimethoxy para-xylene or bis(methoxymethyl)biphenyl, and these curing agents can be used either singly or as a combination of two or more types thereof.

Examples of acid anhydride-based curing agents include maleic acid anhydride, succinic acid anhydride, itaconic acid anhydride, citraconic acid anhydride, phthalic acid anhydride, 1,2,3,6-tetrahydrophthalic acid anhydride, 3,4,5,6-tetrahydrophthalic acid anhydride, hexahydrophthalic acid anhydride, 4-methylhexahydrophthalic acid anhydride, 3-methyl-1,2,3,6-tetrahydrophthalic acid anhydride, 4-methyl-1,2,3,6-tetrahydrophthalic acid anhydride and methyl-3,6-endomethylene-1,2,3,6-tetrahydrophthalic acid anhydride.

Examples of sulfonium salt-based curing agents include alkyl sulfonium salts, benzyl sulfonium salts, dibenzyl sulfonium salts and substituted benzyl sulfonium salts. Specific examples thereof include alkyl sulfonium salts such as 4-acetophenyldimethyl sulfonium hexafluoroantimonate, 4-acetoxyphenyldimethyl sulfonium hexafluoroarsenate, dimethyl-4-(benzyloxycarbonyloxy)phenyl sulfonium hexafluoroantimonate, dimethyl-4-(benzoyloxy)phenyl sulfonium hexafluoroantimonate, dimethyl-4-(benzoyloxy) phenyl sulfonium hexafluoroarsenate and dimethyl-3-chloro-4-acetoxyphenyl sulfonium hexafluoroantimonate; benzyl sulfonium salts such as benzyl-4-hydroxyphenylmethyl sulfonium hexafluoroantimonate, benzyl-4-hydroxyphenylmethyl sulfonium hexafluorophosphate, 4-acetoxyphenylbenzylmethyl sulfonium hexafluoroantimonate, benzyl-4-methoxyphenylmethyl sulfonium hexafluoroantimonate, benzyl-2-methyl-4-hydroxyphenylmethyl sulfonium hexafluoroantimonate, benzyl-3-chloro-4-hydroxyphenylmethyl sulfonium hexafluoroarsenate and 4-methoxybenzyl-4-hydroxyphenylmethyl sulfonium hexafluorophosphate; dibenzyl sulfonium salts such as dibenzyl-4-hydroxyphenyl sulfonium hexafluoroantimonate, dibenzyl-4-hydroxyphenyl sulfonium hexafluorophosphate, 4-acetoxyphenyldibenzyl sulfonium hexafluoroantimonate, dibenzyl-4-methoxyphenyl sulfonium hexafluoroantimonate, dibenzyl-3-chloro-4-hydroxyphenyl sulfonium hexafluoroarsenate, dibenzyl-3-methyl-4-hydroxy-5-tert-butylphenyl sulfonium hexafluoroantimonate and benzyl-4-methoxybenzyl-4-hydroxyphenyl sulfonium hexafluorophosphate; and substituted benzyl sulfonium salts such as p-chlorobenzyl-4-hydroxyphenylmethyl sulfonium hexafluoroantimonate, p-nitrobenzyl-4-hydroxyphenylmethyl sulfonium hexafluoroantimonate, p-chlorobenzyl-4-hydroxyphenylmethyl sulfonium hexafluorophosphate, p-nitrobenzyl-3-methyl-4-hydroxyphenylmethyl sulfonium hexafluoroantimonate, 3,5-dichlorobenzyl-4-hydroxyphenylmethyl sulfonium hexafluoroantimonate and o-chlorobenzyl-3-chloro-4-hydroxyphenylmethyl sulfonium hexafluoroantimonate.

The proportions of the components in the resin composition are not particularly limited as long as the effect of the present invention can be achieved, but are 50 to 99 parts by mass, and preferably approximately 60 to 80 parts by mass, of the epoxy resin (D) and 1 to 50 parts by mass, and preferably approximately 1 to 40 parts by mass, of the curing agent (E) relative to 100 parts by mass of the overall resin composition.

Furthermore, the resin composition according to the present embodiment may, if necessary, contain other additives, such as a curing catalyst (a curing accelerator), a flame retardant, an auxiliary flame retardant, a leveling agent or a coloring agent, at quantities whereby the effect of the present invention is not impaired.

The method for producing the epoxy resin-containing resin composition of the present embodiment is not particularly limited, and it is possible to, for example, homogeneously mix the epoxy resin, the curing agent and a solvent. The solvent used is not particularly limited, and can be toluene, xylene, methyl ethyl ketone, acetone, or the like. These solvents can be used singly or as a combination of two or more types thereof. Furthermore, if necessary, it is possible to blend an organic solvent or a variety of additives in the resin composition in order to adjust the viscosity of the composition.

By heating and drying the resin composition obtained in the manner described above, it is possible to cure the composition while evaporating off the solvent, thereby obtaining a resin substrate of film.

The method and apparatus used to heat and dry the resin composition, and the conditions used therefor, may be similar means to those used in the past or means obtained by improving those used in the past. The specific heating temperature and period can be set as appropriate according to the crosslinking agent and solvent used, and the like, but by heating and drying for a period of 60 to 180 minutes at a temperature of 130 to 200 degrees Celsius, for example, it is possible to cure the resin composition.

The obtained resin substrate (a molded body that is a cured product of the aforementioned resin composition or the like) may be subjected to surface treatment in order to stably form the electrically conductive layer on one surface of the resin substrate. In addition, it is possible to add a variety of additives, for example antioxidants, weathering stabilizers, flame retardants and anti-static agents, to the resin substrate at levels that do not impair the characteristics of the resin substrate.

The resin substrate in the present embodiment may be transparent or opaque, but more preferably has a degree of transparency whereby the total light transmittance is 70% or higher. In such cases, the electrically conductive film can be used as a transparent electrically conductive film. In cases where the polyrotaxane-containing resin composition of the present embodiment, such as that mentioned above, or an epoxy resin composition is used, the aforementioned transparency can be achieved by selecting an epoxy resin or curing agent therefor.

In addition, the thickness of the resin substrate is not particularly limited, but is preferably, for example, 10 to 200 micrometers from perspectives of handling properties, optical characteristics and attachability.

Furthermore, by providing the surface of this resin substrate with an ultrafine concavoconvex shape having an Ra value (the arithmetic mean roughness) of 50 nanometers to 5 micrometers, it is possible to form a similar concavoconvex shape on the electrically conductive layer formed on the surface of the substrate. It is more preferable for the concavoconvex shape of this electrically conductive layer to be a wave-like shape (a wrinkled structure).

This processing method is not limited, but it is possible to obtain a resin substrate having a concavoconvex shape by using a method that uses a metal mold to transfer this type of concavoconvex shape when preparing the resin substrate. By having this type of ultrafine concavoconvex shape, the electrically conductive film can more reliably ensure electrical conductivity when the film is deformed.

Specific examples of the fibrous electrically conductive filler used in the present embodiment are not particularly limited, but can be carbon nanofibers, metal fibers, and the like. For example, at least one type selected from among carbon nanotubes, carbon nanobuds, metal nanowires and combinations thereof can be more preferably used. In an electrically conductive layer that uses these fibrous electrically conductive fillers, innumerable fibrous electrically conductive filler particles become irregularly entangled and electrically conductive filler particles form a mesh-like structure in which innumerable contact points are in contact with each other. By forming an electrically conductive layer having this type of mesh-like structure on one surface of a resin substrate able to undergo elastic deformation, such as that mentioned above, the function of the electrically conductive film can be more reliably maintained due to the film not losing electrical conductivity even when deformed under tension or recovery.

In addition, it is more preferable for the fibrous electrically conductive filler to have a long fiber length and a high aspect ratio, and more specifically, it is preferable for the fibrous electrically conductive filler to have a fiber length of 1 micrometer or higher and an aspect ratio, which is the ratio of the fiber length relative to the average fiber diameter, of 50 or higher. By using these values, electrical conductivity can be more effectively maintained even when the film is deformed under tension or recovery.

The method for forming this type of electrically conductive layer having a mesh-like structure formed from a fibrous electrically conductive filler is not limited in any way. For example, this type of electrically conductive layer can be formed by coating the resin substrate with a dispersion of the fibrous electrically conductive filler, which can be prepared using a publicly known dispersion method, and then evaporating off the solvent. Alternatively, the electrically conductive layer can be formed by using a publicly known method, such as depositing the layer on the resin substrate in a dry process. In yet another aspect, the electrically conductive layer can be produced using a method in which this electrically conductive layer is formed on another substrate using a publicly known method and then transferred to the resin substrate.

Some or all of the electrically conductive layer prepared using such a method may be embedded in the resin substrate layer, and the adhesive properties between the electrically conductive layer and the resin substrate layer can be further enhanced by using this type of embedded constitution.

Dispersing agents, binder components and other additives used in the dispersion liquid can be used at quantities that do not impair the characteristics of the present invention in the electrically conductive layer prepared using such a method.

In addition, the thickness of the formed electrically conductive layer is not particularly limited, but the electrically conductive layer is preferably thin from perspectives such as transparency and attachability, and preferably has a thickness of 1 micrometer or lower.

Moreover, it is possible to use a support body such as a PET film as appropriate when forming the electrically conductive film in the present embodiment. It is possible to obtain the electrically conductive film of the present embodiment by forming the resin substrate on this type of support body and then forming the electrically conductive layer by using a method such as that mentioned above.

In addition, patterning can be carried out by partially removing the electrically conductive layer from the electrically conductive film of the present embodiment. The removal method is not particularly limited, and it is possible to use a routine means or apparatus, such as laser etching or chemical etching.

The electrically conductive film of the present embodiment exhibits excellent recoverability following extension and stress relaxation properties and does not lose electrical conductivity even when subjected to deformations such as extension or recovery, and can therefore be used as an electrode or wiring circuit for a display, touch sensor, solar cell, or the like.

The present Description discloses a variety of features, as described above, but of these, the main features will now be summarized.

One aspect of the present invention is an electrically conductive film obtained by forming an electrically conductive layer having a mesh-like structure formed from a fibrous electrically conductive filler on a resin substrate that is able to undergo elastic deformation. In addition, it is preferable for the stress relaxation rate (R) and the residual strain rate $\alpha$(alpha), as measured in the extension-restoration test described above, to satisfy the following relationships:

$20\% \leq R \leq 95\%$ $0\% \leq \alpha \leq 3\%$

By means of this constitution, it is possible to provide an electrically conductive film which exhibits excellent recoverability following extension and stress relaxation properties and which does not lose electrical conductivity even when subjected to deformations such as extension or recovery.

Furthermore, it is preferable for the resin substrate to contain at least a thermosetting resin and a curing agent for this resin. In this way, it is possible to more reliably obtain a material having particularly excellent stress relaxation properties and recoverability following extension.

In addition, it is preferable for the thermosetting resin to contain an epoxy resin. In this way, it is possible to achieve both high stress relaxation properties and high recoverability, and also possible to achieve heat resistance and toughness.

In addition, in the electrically conductive film, it is preferable for the fibrous electrically conductive filler to contain at least one of carbon nanotubes, carbon nanobuds, metal nanowires and combinations thereof. In this way, the function of the electrically conductive film can be more reliably maintained due to the film not losing electrical conductivity even when deformed under tension or recovery.

Furthermore, it is preferable for the fibrous electrically conductive filler to have a fiber length of 1 micrometer or higher and an aspect ratio (length/diameter) of 50 or higher. In this way, electrical conductivity can be more effectively maintained even when the film is deformed under tension or recovery.

In addition, it is preferable for the thickness of the electrically conductive layer to be 1 micrometer or lower. This is advantageous in terms of transparency and attachability.

In addition, in the electrically conductive film, it is preferable for some or all of the electrically conductive layer to be buried in the resin substrate able to undergo elastic deformation. By using this type of constitution, the adhesive properties between the electrically conductive layer and the resin substrate layer can be further enhanced.

Furthermore, it is preferable for the surface of the resin substrate to have an ultrafine concavoconvex structure having an Ra value of 50 nanometers to 5 micrometers. In this way, electrical conductivity can more reliably ensured when the electrically conductive film is deformed.

In addition, it is preferable for the electrically conductive film to have a total light transmittance of 70% or higher. In this way, the electrically conductive film can be used as a transparent electrically conductive film.

Another aspect of the present invention is a patterned electrically conductive film obtained by partially removing the electrically conductive layer of the electrically conductive film.

Furthermore, the present invention encompasses displays, touch sensors and solar cells that use the electrically conductive film. The electrically conductive film of the present invention can be used in a wide variety of applications which can closely follow free-form surfaces and adapt to significant deformations.

The present invention will now be explained in greater detail through the use of working examples, but is in no way limited to these working examples.

EXAMPLES

First, the various materials used in the present working examples are as follows.
(Thermosetting Resin)
  Polyrotaxane ("A1000" manufactured by Advanced Softmaterials, Inc., containing PEG as the axial molecule, α-cyclodextrin as the cyclic molecule, and OH groups as reactive groups)
  Epoxy resin ("JER1003" manufactured by Mitsubishi Chemical Corp., 7 to 8 methyl groups, 2 functional groups, molecular weight 1300)
  Epoxy resin ("EXA-4816" manufactured by DIC Corporation, molecular weight 824, many methyl groups, 2 functional groups)
  Epoxy resin "YP50" manufactured by Nippon Steel & Sumikin Chemical Co., Ltd., molecular weight 60,000 to 80,000, many methyl groups, 2 functional groups)
  Ethylene oxide adduct type hydroxyphenylfluorene type epoxy resin ("EG-280" manufactured by Osaka Gas Chemicals Co., Ltd.)
  Propylene oxide adduct type bisphenol A type epoxy resin ("EP4003S" manufactured by Adeka Corporation)
(Curing Agents)
  Polyfunctional phenol-based curing agent ("GPH-103" manufactured by Nippon Kayaku Co., Ltd., biphenyl aralkyl type phenol compound)
  Imidazole-based curing accelerator ("2E4MZ" manufactured by Shikoku Chemicals Corporation, 2-ethyl-4-methylimidazole)
  Polyisocyanate (isocyanate, "DN 950" manufactured by DIC Corporation)
  Cationic curing agent ("SI-150" manufactured by Sanshin Chemical Industry Co., Ltd., sulfonium hexafluoroantimonate)
(Resin Substrate Comparative Examples)
PET film ("A4300" manufactured by Toyobo Co., Ltd.)
(Aqueous Solution Containing Carbon Nanotubes (CNT))
SWCNT: IsoNonotubes-M (manufactured by NanoIntegris, CNT diameter 1.7 nanometers, length 1 micrometer)
DWCNT: Nanocyl NC2100 (manufactured by Nanocyl, CNT diameter 3.5 nanometers, length 1-10 micrometers)
(Silver Nanowires)
Solution containing Ag nanowires (manufactured by Sigma-Aldrich, diameter 60 nanometers, length 10 micrometers)
  <Preparation of Resin Substrates 1 to 5>
  Resin compositions for resin substrates 1 to 5 were prepared by adding the blending components (parts by mass) shown in Table 1 below to a solvent (methyl ethyl ketone) so that the solid content concentration was 40 mass %, and then homogeneously mixing the components.

Next, the obtained resin composition was coated on a PET film (support body) having a thickness of 75 micrometers using a bar coater, dried for 10 minutes at 100 degrees Celsius so as to remove the solvent, and then cured by heating for 60 minutes at 170 degrees Celsius so as to obtain a resin film having a thickness of 50 micrometers on the PET film.

TABLE 1

|  |  | Resin sub-strate 1 | Resin sub-strate 2 | Resin sub-strate 3 | Resin sub-strate 4 | Resin sub-strate 5 |
|---|---|---|---|---|---|---|
| Component (A) | A1000 | 100 | 100 | — | — | — |
|  | jER1003 | 100 | — | — | — | — |
|  | YP-50 | — | 100 | — | — | — |
|  | EXA4816 | — | — | 100 | — | — |
|  | EG-280 | — | — | — | 100 | — |
|  | EP-4003S | — | — | — | — | 100 |
| Component (B) | GPH-103 | — | — | — | 49 | 49 |
|  | 2E4MZ | 1.5 | 1.5 | — | 0.15 | 0.15 |
|  | SI-150L | — | — | 2 | — | — |
|  | DN-950 | 45 | 45 | 45 | — | — |

<Preparation of Electrically Conductive Film>

Examples 1 to 2, 4 to 5, 7 to 8 and 10, Comparative Examples 1 to 2

A CNT-containing aqueous solution having a concentration of 200 ppm was obtained by measuring out the CNTs, placing the CNTs in a 5 wt. % aqueous solution of sodium dodecyl sulfate and then dispersing for 24 hours using ultrasonic waves.

Next, an electrically conductive film having a CNT layer (electrically conductive layer) having a thickness of 10 nanometers was obtained by coating the CNT-containing aqueous solution on one surface of a resin substrate shown in Table 2 or Table 3 using a bar coater, and then drying for 30 minutes at 120 degrees Celsius so as to remove the solvent.

Examples 3, 6 and 9, Comparative Example 3

An Ag nanowire-containing aqueous solution was obtained by preparing Ag nanowires in an aqueous solution so that the Ag solid content concentration was 0.5 wt. %.

Next, an electrically conductive film having an Ag nanowire layer thickness of 0.2 micrometers was obtained by coating the Ag nanowire-containing aqueous solution on one surface of a resin substrate shown in Table 2 or Table 3 using a bar coater, and then drying for 30 minutes at 120 degrees Celsius so as to remove the solvent.

Comparative Examples 4 to 8

An ITO film having a thickness of 20 nanometers was formed on one surface of a resin substrate shown in Table 3 (film formation conditions: magnetron sputtering method, ITO sintered body used as a target, Ar partial pressure 0.5 Pa, 100 W).

A piece of film (thickness: 50 micrometer, sample shape: No. 6 type dumbbell (width of measured portion: 4 mm, length of linear portion: 25 mm)) was obtained from the obtained electrically conductive film and used as a sample in the following evaluations.

<Extension-Restoration Test>

In the extension-restoration test used in the present embodiment, the samples of the working examples and comparative examples were subjected to an extension process and then a restoration process under the conditions described below, and the stress relaxation rate (R) and the residual strain rate α were calculated using the calculation methods described below.

(Extension Process Conditions)

In order to eliminate deflection generated when the test piece was attached to the clamp, deflection correction was carried out at a force of 0.05 N or lower.

Speed of testing: 25 mm/min (0 to 25% extension)
Temperature conditions: 23 degrees Celsius
Extension/holding conditions: Holding for 5 minutes at 25% extension (Restoration Process Conditions)

Speed of testing: 0.1 mm/min (until the tensile force reaches

0±0.05 N

)

Temperature conditions: 23 degrees Celsius

Stress relaxation rate calculation method: The tensile force was measured at the point when the extension process is complete, and this was defined as the initial tensile force ($F_{AO}$). The amount of strain was then maintained for 5 minutes under the extension/holding conditions, after which the tensile force was measured. This was defined as $F_A(t_{10})$. The stress relaxation rate (R) was calculated using the following formula.

$$R = \frac{F_{AO} - F_A(t5)}{F_{AO}} \times 100$$

Residual strain rate calculation method: The amount of strain was measured at the point where the tensile force in the restoration process reached 0±0.05 N, and this was defined as the residual strain rate α.

The obtained stress relaxation rates (R) and residual strain rates α are shown in Tables 2 and 3.

Furthermore, when the resin compositions were extended to 15 to 20% in the extension-restoration test, the slope of the change in tensile force relative to the amount of strain during restoration and that during extension (slope during restoration/slope during extension) were determined. These results are also shown in Tables 2 and 3.

<Stress Relaxation Properties Test>

The samples of the working examples and comparative examples were subjected to an extension process under the conditions described below using a tensile-compression tester in accordance with ISO 3384, and at the point where the extension was complete, the tensile force was measured and defined as the initial tensile force ($F_{BO}$). 30 minutes thereafter, the tensile force ($F_B(t_{30})$) was measured.

(Extension Process Conditions)

In order to eliminate deflection generated when the test piece was attached to the clamp, deflection correction was carried out. The deflection correction was carried out at a force of 0.05 N or lower.

Speed of testing: 25 mm/min (up to 50% extension)
Temperature conditions: 23 degrees Celsius
Extension/holding conditions: Holding for 30 minutes at 50% extension In addition, the value of $F_B(t_{30})/F_{BO}$ was calculated. The results are shown in Tables 2 and 3.

<Measurement of Surface Resistance Value>

The surface resistance value of the obtained electrically conductive films was measured using a tester in accordance with ISO 3195. The results are shown in Tables 2 and 3.

<Measurement of Total Light Transmittance>

The total light transmittance of the obtained electrically conductive films was measured using a tester in accordance with ISO 2556. The results are shown in Tables 2 and 3.

<Measurement of Rate of Increase in Resistance During Stretching Operation>

The obtained electrically conductive films were cut to length of 6 cm and widths of 5 mm and set on a film drawing machine so that the distance between clamps was 4 cm. Next, the resistance value was measured using a resistance meter (RM3548 manufactured by Hioki E.E. Corporation) at a position whereby the distance between terminals was 3 cm before the film was extended, when the film was extended to an extension of 25% and when the clamps were released and the film returned to its original position. The increase in resistance from the resistance value prior to stretching is shown in terms of percentage in Tables 2 and 3.

TABLE 2

| | Example 1 | Example 2 | Example 3 | Example 4 | Example 5 | Example 6 | Example 7 | Example 8 | Example 9 | Example 10 |
|---|---|---|---|---|---|---|---|---|---|---|
| Resin substrate | Resin substrate 1 | Resin substrate 1 | Resin substrate 2 | Resin substrate 2 | Resin substrate 3 | Resin substrate 3 | Resin substrate 4 | Resin substrate 4 | Resin substrate 5 | Resin substrate 5 |
| Electrically conductive filler | SWCNT | DWCNT | Ag nanowires | SWCNT | DWCNT | Ag nanowires | SWCNT | DWCNT | Ag nanowires | SWCNT |
| Stress relaxation rate (R) (20-95%) | 31.0% | 31.0% | 39.5% | 39.5% | 43.0% | 43.0% | 82.7% | 82.7% | 53.2% | 53.2% |
| Residual strain (α) (20-3%) | 0.8% | 0.8% | 1.1% | 1.1% | 2.7% | 2.7% | 2.8% | 2.8% | 2.7% | 2.7% |
| Surface resistance (Ω/□) | 450 Ω/□ | 600 Ω/□ | 50 Ω/□ | 450 Ω/□ | 600 Ω/□ | 50 Ω/□ | 450 Ω/□ | 600 Ω/□ | 50 Ω/□ | 450 Ω/□ |
| Total light transmittance (%) | 83% | 83% | 83% | 83% | 83% | 83% | 70% | 70% | 70% | 70% |
| Resistance increase after film extension (%) | 80% | 80% | 120% | 80% | 80% | 120% | 80% | 80% | 120% | 80% |
| Resistance increase after film recovery (%) | 20% | 20% | 35% | 20% | 20% | 35% | 20% | 20% | 35% | 20% |

TABLE 3

| | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|
| Resin substrate | A4300 | A4300 | A4300 | Resin substrate 1 | Resin substrate 2 | Resin substrate 3 | Resin substrate 4 | Resin substrate 5 |
| Electrically conductive filler | SWCNT | DWCNT | Ag nanowires | ITO | ITO | ITO | ITO | ITO |
| Stress relaxation rate (R) (0-95%) | 2.0% | 2.0% | 2.0% | 31.0% | 39.5% | 43.0% | 82.7% | 53.2% |
| Residual strain (α) | 20.0% | 20.0% | 20.0% | 0.8% | 1.1% | 2.7% | 2.8% | 2.7% |
| Surface resistance (Ω/□) | 450 Ω/□ | 600 Ω/□ | 50 Ω/□ | 150 Ω/□ | 150 Ω/□ | 150 Ω/□ | 150 Ω/□ | 150 Ω/□ |
| Total light transmittance (%) | 85% | 85% | 85% | 85% | 85% | 85% | 70% | 70% |
| Resistance increase after film extension (%) | 80% | 80% | 120% | ∞ | ∞ | ∞ | ∞ | ∞ |

TABLE 3-continued

| | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|
| Resistance increase after film recovery (%) | No recovery | No recovery | No recovery | 1200% | 1200% | 1200% | 1200% | 1200% |

(Results and Discussion)

In Comparative Examples 1 to 3, electrically conductive films were prepared by using a PET film (A4300), which is a conventional thermoplastic film and has been actually used as a flexible substrate for electrically conductive films, as the resin substrate and using the CNTs or Ag nanowires that were the electrically conductive materials used in the examples in the present invention, and these electrically conductive films were compared with the examples.

In addition, in Comparative Examples 4 to 8, electrically conductive films were prepared by using ITO as an electrically conductive layer used in conventional transparent electrically conductive films and using resin substrates 1 to 5, which were used in the examples in the present invention, and these electrically conductive films were compared with the examples.

The results showed that in comparison with electrically conductive films that used the resin substrate of the present invention (Examples 1 to 10), electrically conductive films that used a PET film (Comparative Examples 1 to 3) exhibited extremely low stress relaxation rates even in cases where electrically conductive materials were used, exhibited high residual strain, and exhibited low film recoverability. In addition, Examples 1 to 10 exhibited excellent stress relaxation properties and underwent little increase in resistance after stretching, and even after recovery.

Meanwhile, electrically conductive-films that used a conventional ITO in the electrically conductive layer (Comparative Examples 4 to 8) exhibited excellent stress relaxation properties, but the resistance value following film extension could not be detected, and the electrically conductive layer was almost completely lost. In addition, the resistance values of these electrically conductive films recovered to a certain extent following film restoration, but the resistance value following restoration was significantly higher than that prior to stretching.

Therefore, the electrically conductive film of the present invention is far superior in terms of stress relaxation properties and recoverability than various materials used in the past, is flexible, and exhibits excellent electrical conductivity after stretching and after recovery.

This application is based on Japanese Patent Application No. 2013-212790 filed on Oct. 10, 2013 and International Patent Application No. PCT/JP2014/001304 filed on Mar. 7, 2014, and the contents of this earlier application are included in the present application.

In order to embody the present invention, the present invention has been appropriately and adequately explained by means of the specific embodiments, but it should be recognized that a person skilled in the art could easily amend and/or reform the embodiments. Therefore, as long as amended or reformed modes carried out by a person skilled in the art do not depart from the scope of the claims described in the claims of the present invention, these amended or reformed modes are interpreted as being encompassed by the scope of the claims.

INDUSTRIAL APPLICABILITY

The present invention exhibits broad industrial applicability in a wide range of technical fields, such as optics, electronics, adhesives and medicines.

The invention claimed is:

1. An electrically conductive film comprising
an electrically conductive layer having a mesh-like structure formed from a fibrous electrically conductive filler on a resin substrate that exhibits elastic deformation, wherein
a stress relaxation rate (R) and a residual strain rate (a) of the electrically conductive film, as measured in a tensile-compression test described below, satisfy the following relationships:

$20\% \leq R \leq 95\%$ and $0\% \leq \alpha \leq 3\%$;

wherein the tensile-compression test is subjecting a piece of the electrically conductive film having a thickness of 50 μm in a shape of a No. 6 dumbbell having a width of measured portion of 4 mm and length of linear portion of 25 mm to an extension process, a holding process, and then a restoration process using a tensile-compression tester in accordance with ISO 3384,
wherein the extension process conditions include
deflection correction being carried out at a force of 0.05 N or lower,
a speed of testing of 25 mm/min from 0% to 25% extension, and temperature of 23° C.,
wherein holding process conditions are holding for 5 minutes at 25% extension; and
wherein restoration process is conducted at a speed of testing of 0.1 mm/min until the tensile force reaches 0±0.05 N, and temperature of 23° C.;
the stress relaxation rate (R) being calculated using the following formula:

$$R = \frac{F_{AO} - F_A(t5)}{F_{AO}} \times 100$$

wherein $F_a(t_0)$ is the tensile force in the piece of electrically conductive film measured immediately after the extension process is complete, $F_A(t_5)$ is the tensile force in the piece of electrically conductive film immediately after the holding process, and
wherein the residual strain rate (α) being defined as the amount of strain being measured in the electrically conductive film immediately after the restoration process; and
wherein the resin substrate contains at least a thermosetting resin, a polyrotaxane, and a curing agent, and
wherein the fibrous electrically conductive filler contains at least one of carbon nanotubes, carbon nanobuds, metal nanowires and combinations thereof.

2. The electrically conductive film according to claim 1, wherein the thermosetting resin contains an epoxy resin.

3. The electrically conductive film according to claim 1, wherein the fibrous electrically conductive filler has a fiber length of 1 micrometer or higher and an aspect ratio (length/diameter) of 50 or higher.

4. The electrically conductive film according to claim 1, wherein the thickness of the electrically conductive layer is 1 micrometer or less.

5. The electrically conductive film according to claim 1, wherein a part of or all of the electrically conductive layer is embedded in the resin substrate that is able to undergo elastic deformation.

6. The electrically conductive film according to claim 1, wherein the surface of the resin substrate has an ultrafine concavoconvex structure having an Ra value of not lower than 50 nanometers and not higher than 5 micrometers.

7. The electrically conductive film according to claim 1, wherein a total light transmittance is 70% or higher.

8. A patterned electrically conductive film obtained by partially removing the electrically conductive layer according to claim 1.

9. A display that comprises the electrically conductive film according to claim 1.

10. A touch sensor that comprises the electrically conductive film according to claim 1.

11. A solar cell that comprises the electrically conductive film according to claim 1.

* * * * *